(12) United States Patent
Inoue (10) Patent No.: US 6,403,998 B1
(45) Date of Patent: Jun. 11, 2002

(54) SOLID-STATE IMAGE SENSOR OF A MOS STRUCTURE (75) Inventor: Ikuko Inoue, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/435,464

(22) Filed: Nov. 8, 1999

(30) Foreign Application Priority Data

Nov. 9, 1998 (JP) .......................... 10-317833

(51) Int. Cl.$^7$ .......................................... H01L 27/146
(52) U.S. Cl. ........................ 257/292; 257/369; 257/432
(58) Field of Search ................................ 257/291, 292, 257/369, 544

(56) References Cited

U.S. PATENT DOCUMENTS

| | | | |
|---|---|---|---|
| 4,665,422 A | | 5/1987 | Hirao et al. |
| 5,841,126 A | * | 11/1998 | Fossum et al. ............. 257/292 |
| 5,854,100 A | | 12/1998 | Chi |
| 5,977,576 A | * | 11/1999 | Hamasaki ................... 257/292 |
| 5,986,297 A | * | 11/1999 | Guidash et al. ............ 257/292 |
| 6,023,293 A | * | 2/2000 | Watanabe et al. .......... 257/291 |
| 6,184,055 B1 | * | 2/2001 | Yang et al. ................. 257/292 |

FOREIGN PATENT DOCUMENTS

| | | |
|---|---|---|
| JP | 4-30472 | 2/1992 |
| JP | 10-12855 | 1/1998 |

* cited by examiner

Primary Examiner—Gene M. Munson
(74) Attorney, Agent, or Firm—Finnegan, Henderson, Farabow, Garrett & Dunner LLP (57) ABSTRACT In a MOS type solid-state image sensor having an image pickup area formed at a semiconductor substrate and comprising a two-dimensional array of row and column unit cells including a photoelectric conversion section and signal scanning circuit, a first p well area is provided in a surface portion of an n type silicon substrate and a second p well area is selectively provided in the surface portion of the first p well area and is higher in p type impurity concentration than the first p well area. In the image pickup area, the photoelectric conversion section is formed in the first p well area and the signal scanning circuit section is formed in the second p well area.

6 Claims, 12 Drawing Sheets

SOLID-STATE IMAGE SENSOR OF A MOS STRUCTURE

BACKGROUND OF THE INVENTION

The present invention relates to a solid-state image sensor of a MOS type structure which picks up, in amplified form, signal charges obtained by photodiodes of a photoelectric conversion section and, more in particular, a MOS type solid-state image sensor having two-dimensional array of row and column unit cells over a semiconductor substrate and including a photoelectric conversion section and signal scanning circuit section.

As the solid-state image sensor there have been conventionally known mainly a charge coupled device type solid-state image sensor and MOS type solid-state image sensor.

The MOS type solid-state image sensor in which a signal charge detected at a photoelectric conversion section (photodiode), at each pixel (unit cell), is amplified by a transistor has the features of a high sensitivity, single power supply driving and low dissipation power. In more detail, the potential of a signal charge storage section is modulated by a signal charge generated by the photoelectric conversion and the amplification factor of the amplifying transistor in the pixel is modulated by the potential. Since such an amplification function is possessed in the pixel, the MOS type solid-state image sensor has been expected as the solid-state image sensor suitable to the reduction of pixel size against an increase in the number of pixels and reduction in image size.

Figure 1:
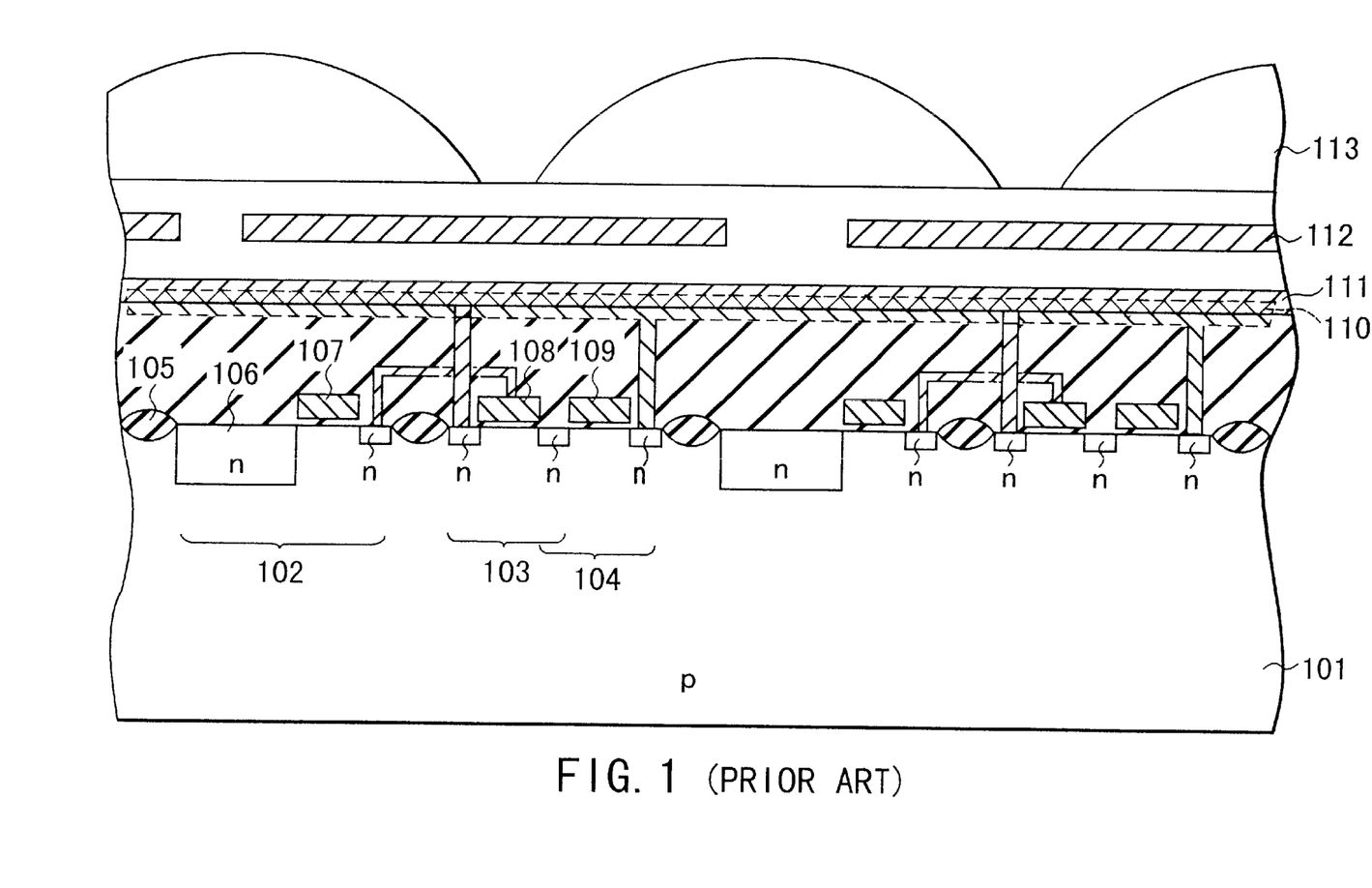
FIG. 1 is a cross-sectional view diagrammatically showing a basic structure of a conventional MOS type solid-state image sensor.

FIG. 1 is a diagrammatic view showing a cross-sectional structure of a conventional MOS type solid-state image sensor. In FIG. 1, reference numeral 101 shows a p type substrate; 102 a photoelectric conversion section; 103 an amplifying transistor; 104 an address transistor; 105 a field oxide film for element isolation; 106 a photodiode; 107 a signal reading-out gate of a reading-out transistor; 108 an amplifying gate; 109 an address gate; 110 a drain line; 111 a signal line; 112 a light shielding film; and 113 a light condensing lens.

This kind of MOS type solid-state image sensor and above-mentioned CCD type solid-state image sensor have a common feature in that photoelectric conversion is effected at the photodiode formed at an Si substrate interface. In the CCD type solid-state image sensor, electrons as photoelectrically converted signal charges are transferred in a diffusion region (signal transfer section) formed in the same Si substrate interface, whereas, in the MOS type solid-state image sensor, photoelectrically converted electrons are transmitted in connection lines. Therefore, when strong light is incident on respective pixels, there occurs, in the CCD type solid-state image sensor, a phenomenon called "smearing" emerging as vertical bands on a reproduced image due to the leaking, into the signal transfer section, of electrons overflowed from the photodiode and a phenomenon called "blooming" which emerges as a spread image resulting from the overflowed electrons leaking into an adjacent pixel. For the case of a single-plate CCD type solid-state image sensor, overflowed electrons leak into the adjacent pixel, thus causing the so-called "color mixing", that is, the deterioration of a color reproduction resulting from a mixing with an adjacent different color filter signal.

For the case of the MOS type solid-state type image sensor, on the other hand, "smearing" never occurs because the signal transfer section is not present in the substrate. However, there still occur the "blooming" and "color mixing" resulting from the leaking of overflowed electrons into the adjacent pixel or the "blooming" and "color mixing" resulting from signal leaking from a deeper area in the substrate.

Further, in the MOS type solid-state image sensor, a signal scanning circuit section (the amplifying transistor 103, address transistor 104, etc. in FIG. 1) is present between the photodiodes and, in comparison with the CCD type solid-state image sensor, the MOS type solid-state image sensor is favorable against the signal leaking between the adjacent pixels. In a recent public acceptance of an electronic still camera, etc., there is a growing demand for a low-cost but high performance MOS type solid-state image sensor and an improvement in the MOS type solid-state image sensor is more requested in terms of the device characteristics.

Further, the MOS type solid-state image sensor has an advantage in that various kinds of circuits, such as a photoelectric conversion section, signal scanning circuit section, peripheral circuits (a register circuit, timing circuit), A/D (Analog to Digital) converter, command circuit, D/A (Digital to Analog) converter, and DSP (Digital Signal Processor), can be formed one at a time on the same substrate. This ensures the advantage of forming a small system in the MOS type solid-state image sensor and offering a low cost product (system). When, however, many kinds of circuits are set over the same substrate, the following problem arises. That is, in the case where many kinds of circuits are so set, the analog circuit and digital circuit are formed in a mixed way and, in this case, there is a fear that the clock noise of the digital circuit will produce analog waveform noise and that the oscillation of the substrate by the digital clock will produces analog waveform noise.

BRIEF SUMMARY OF THE INVENTION

It is accordingly an object of the present invention to provide a solid-state image sensor of a MOS type structure which can prevent signal charges which are generated at a deeper area of a substrate from leaking into an adjacent pixel and suppress the phenomena "blooming" and "color mixing".

Another object of the present invention is to provide a solid-state image sensor of a MOS type structure which, in a case where many kinds of circuits are mixedly mounted at the same substrate, can prevent noise in a digital circuit, as well as the oscillation of the substrate, which would exert any adverse effect on an analog waveform.

In order to achieve the object of the present invention, there is provided a solid-state image sensor of a MOS type structure which comprises an n type semiconductor substrate, at least one first p well area provided in a surface portion of the n type semiconductor substrate, a plurality of second p well areas selectively provided at a surface portion of the first p well area and higher in p type impurity concentration than the first p well area, an image pickup area comprising a two-dimensional array of row and column unit cells having a photoelectric conversion section provided in the first p well area and a signal scanning circuit section in the second p well area, and a plurality of signal lines respectively reading out signal charges from the unit cells in the image pickup area.

There is further provided a solid-state image sensor of a MOS type structure comprising an n type semiconductor substrate, a plurality of p well areas selectively provided in a surface portion of the n type semiconductor substrate, an image pickup area comprising a two-dimensional array of row and column unit cells having a photoelectric conversion section formed at the surface portion of the n type semiconductor substrate and a signal scanning circuit section formed in the p well area, a plurality of signal lines respectively reading out signal charges from the unit cells of the image pickup area, a p type buried area provided at a base portion of the n type semiconductor substrate and higher in p type impurity concentration than the p well area, and an element isolation area respectively provided at the surface of the n type semiconductor substrate at least corresponding to the boundary area of the unit cell-to-unit cell area and an element isolation p type area formed from the surface of the n type semiconductor substrate along the element isolation area to a depth area deeper than the depth of the photoconductive conversion section and higher in p type impurity concentration than the p well area.

According to the solid-state image sensor of a MOS type structure of the present invention, it is possible to, as the semiconductor substrate, an n type substrate and, by doing so, those signal charges generated at a deeper area of the semiconductor substrate can be discharged toward the substrate's ground side.

Since, in particular, the image pickup area is formed in the first p well area and signal scanning circuit section is formed in the second p well area, those signal charges generated at the deeper area of the substrate can be positively prevented from leaking into an adjacent pixel.

In the case where the element isolation p type area is formed along the element isolation area, more positive isolation can be achieved between adjacent pixels.

Further, in the case where the p type buried area is formed at the boundary area between the n type substrate and the p well area, it is possible to more positively prevent a leakage of signals coming from a deeper area of the substrate.

In the case where the first p well area is formed with a concentration gradient of a gradually increasing impurity concentration it is possible to prevent an excessive discharge of signal charges by the n type substrate.

Further, there is also provided a solid-state image sensor of a MOS type structure according to the present invention comprising an n type semiconductor substrate, at least one first p well area provided in a surface portion of the n type semiconductor substrate and having a plurality of second p well areas, at least one third p well area provided in a surface portion of the n type semiconductor substrate and spaced a predetermined distance from the first p well area, an image pickup area comprising a two-dimensional row and column unit cells formed at the first p well area and including a photoelectric conversion section and signal scanning circuit section, a plurality of signal lines respectively reading out signal charges from the unit cells in the image pickup area, and a peripheral circuit area formed in the third p well area.

According to the solid-state image sensor of a MOS type structure according to the present invention, the image pickup area (photoelectric conversion section and signal scanning circuit section) and its peripheral area can be formed in different p well areas. By doing so it is possible to isolate many kinds of circuits, in particular, isolate the image pickup area as an analog circuit and a digital circuit of the peripheral circuit area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be explained below by referring to the accompanying drawing.

(First Embodiment)

Figure 2:
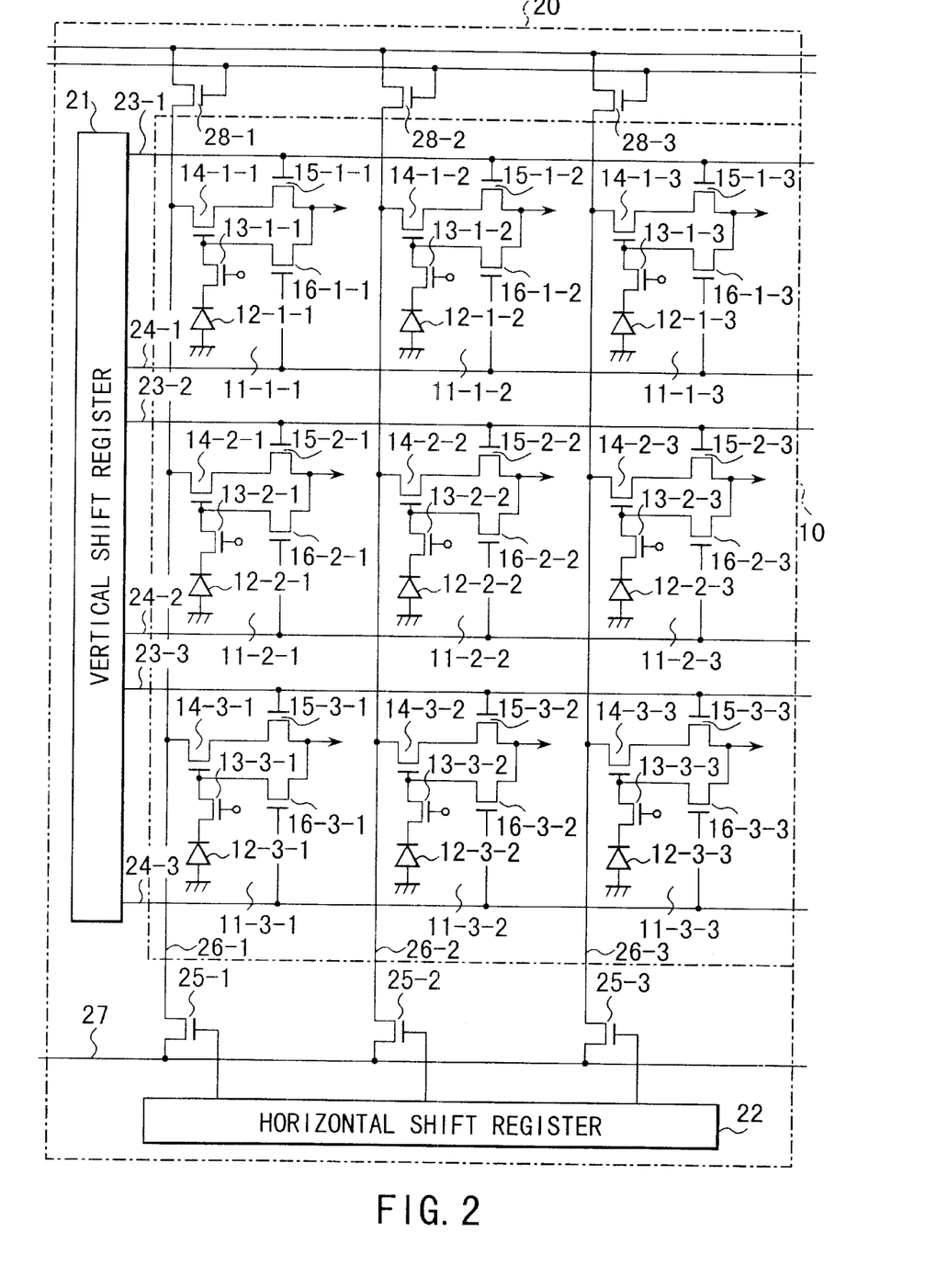
FIG. 2 is a practical circuit of a MOS type solid-state image sensor according to a first embodiment of the present invention.

FIG. 2 is a circuit diagram schematically showing a MOS type solid-state image sensor according to a first embodiment of the present invention.

An image pickup area 10 is formed as a plurality (9 in this case) of unit cells 11 (11-1-1, 11-1-2, ..., 11-3-3) each constituting a pixel, for example, as a two-dimensional array of three rows X three columns.

The respective unit cell 11 comprises a photodiode 12 (12-1-1, 12-1-2, ..., 12-3-3) for photoelectric conversion, reading-out transistor 13 (13-1-1, 13-1-2, ..., 13-3-3) for reading out its signal charge, amplifying transistor 14 (14-1-1, 14-1-2, ..., 14-3-3), vertical select transistor (15-1-1, 15-1-2, ..., 15-3-3) for selecting a line for reading out the signal charge and reset transistor 16 (16-1-1, 16-1-2, ..., 16-3-3) for resetting the signal charge. In this case, a photoelectric conversion section is comprised of the photodiode 12 and reading-out transistor 13 and a signal scanning circuit section is comprised of the amplifying transistor 14, vertical select transistor 15 and reset transistor 16.

In a practical MOS type solid-state image sensor, the image pickup area 10 is comprised of many more unit cells 11.

At the peripheral area of the image pickup area 10, a vertical shift register 21, horizontal shift register 22, etc., are provided as constituting a peripheral circuit section 20. Horizontal address lines 23 (23-1, ..., 23-3) and reset lines 24 (24-1, ..., 24-3) are arranged in a horizontal direction from the vertical shift register 21. The horizontal address line 23 for deciding a line for reading out a signal charge is connected to the gate of the respective vertical select transistor 15. The reset line 24 is connected to the gate of the respective reset transistor 16. Vertical signal lines 26 (26-1, ..., 26-3) are connected to the horizontal shift register 22 through horizontal select transistors 25 (25-1, ..., 25-3). The vertical signal line 26 is connected to the source of the respective amplifying transistors 14. Further, a horizontal signal line 27 is connected to one end (a horizontal shift register 22 side) of the vertical signal line 26 through the horizontal select transistor 25. Load transistors 28 (28-1, ..., 28-3) are provided at the other terminal of the vertical signal line 26.

The circuit arrangement of the MOS type solid-state image sensor in the present embodiment is basically the same as that: of the conventional device but is different therefrom in terms of the device structure.

Figure 3:
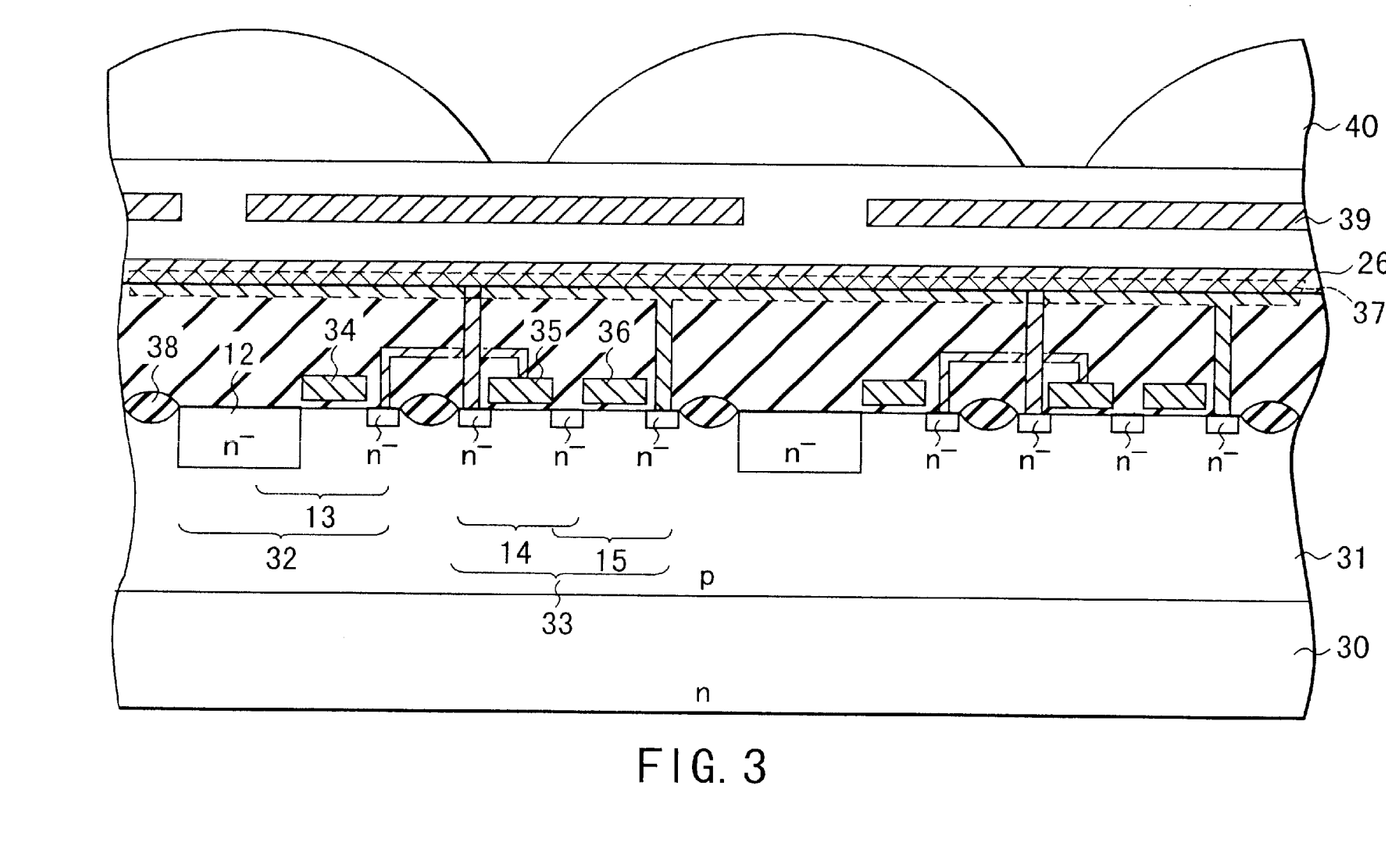
FIG. 3 is a cross-sectional view diagrammatically showing a basic structure of the MOS type solid-state image sensor according to the first embodiment of the present invention.

FIG. 3 is a cross-sectional view schematically showing a basic structure of the MOS type solid-state image sensor according to the present embodiment, noting that, in FIG. 3, a description is omitted regarding the reset transistor.

In FIG. 3, reference numeral 30 shows an n type silicon substrate and a p well region 31 is formed in a surface portion of the substrate 30. And a photo-electric conversion section 32 having the photodiode (n⁻ type diffusion layer) 12 and reading-out transistor 13, as well as the signal scanning circuit section 33 having the amplifying transistor 14, vertical select transistor 15 and reset transistor (not shown), is formed at the surface layer of the p well region 31.

The photodiode 12 is formed with an n type impurity diffused in a major surface of the p well region 31. The reading-out transistor 13 is such that the photodiode 12 serves as a source and a signal reading-out gate 34 is formed between the source and the drain. Further, the amplifying transistor 14 is such that an amplifying gate 35 is formed between the source and the drain, and the amplifying gate 35 is connected to the drain of the reading-out transistor 13. The vertical select transistor 15 has its source shared with the drain of the amplifying transistor 14 and its address gate 36 formed between the source and the drain.

It is to be noted that the reference numeral 26 in FIG. 3 shows the vertical signal line connected to the source of the amplifying transistor 14 and 37 a drain line connected to the drain of the vertical select transistor 15. Further, 38 shows a field oxide film for element isolation; 39 a light shielding film and 40 a light condensing lens.

Here, the above-mentioned n type silicon substrate 30 has a resistivity of about 10 to 50 Ω and a p well area 31 whose p type impurity concentration is about $1 \times 10^{14}$ to $1 \times 10^{16}$ cm³ is formed by a diffusion or epitaxial growth in the surface portion of the substrate 30. Similarly, in also a formation area of a peripheral circuit section 20 such as the registors, timing generation circuit and signal amplifying circuit, etc., a p well area (not shown) is formed whose p type impurity concentration is about $1 \times 10^{16}$ to $1 \times 10^{18}$ cm³. Thereafter, the photoelectric conversion section 32, signal scanning circuit section 33 and peripheral circuit section. (not shown) are formed in the respective p well area.

FIGS. 4A to 4D diagrammatically show a process for forming a photoelectric conversion section 32 and signal scanning circuit section 33 in accordance with the above-mentioned manufacturing method.

Figure 4A:
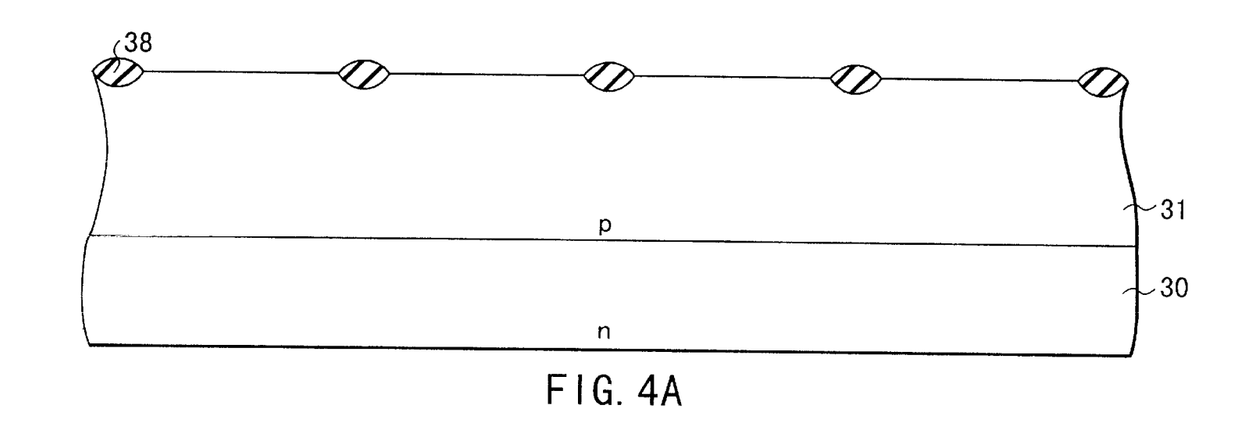
FIGS. 4A to 4D are cross-sectional views showing a process for explaining one example of a manufacturing method of a MOS type solid-state image sensor according to the first embodiment of the present invention.
Figure 4B:
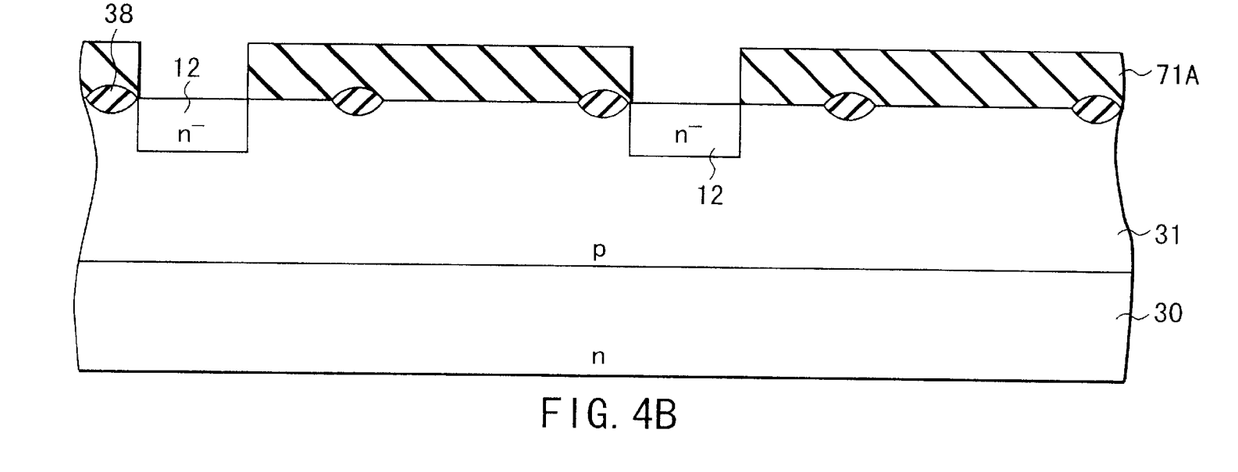

That is, in a state (See FIG. 4A) in which a p well area 31 and field oxide film 38 are formed at the surface portion of an n type silicon substrate 30, a signal reading-out gate 34, amplifying gate 35, address gate 36, and the gate of a reset transistor 16 (none of which are shown) are formed. For example, as shown in FIG. 4B a desired resist pattern 71A is formed on the surface of the p well area 31 and, using the resist pattern 71A as a mask (or in selfalignment with the signal reading-out gate 34), a photodiode 12 is formed in the surface portion of the p well area 31.

Figure 4C:
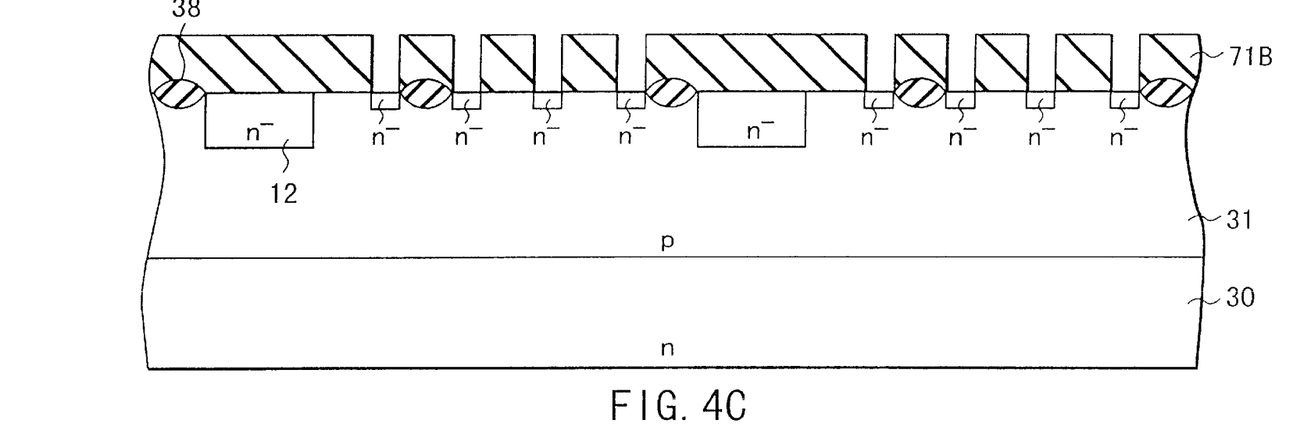

After the above-mentioned pattern 71A has been eliminated, for example, a desired resist pattern 71B is formed on the surface of the p well area 31 as shown in FIG. 4C and, using the pattern 71B as a mask (or in selfalignment with the signal reading-out gate 34, amplifying gate 35, address gate 36, and the gate of the reset transistor 16), n⁻ diffusion layers serving as sources and drains of transistors 13, 14, 15, 16 (excluding the source of a reading-out transistor) are formed in the surface portion of the p well area 31.

Figure 4D:
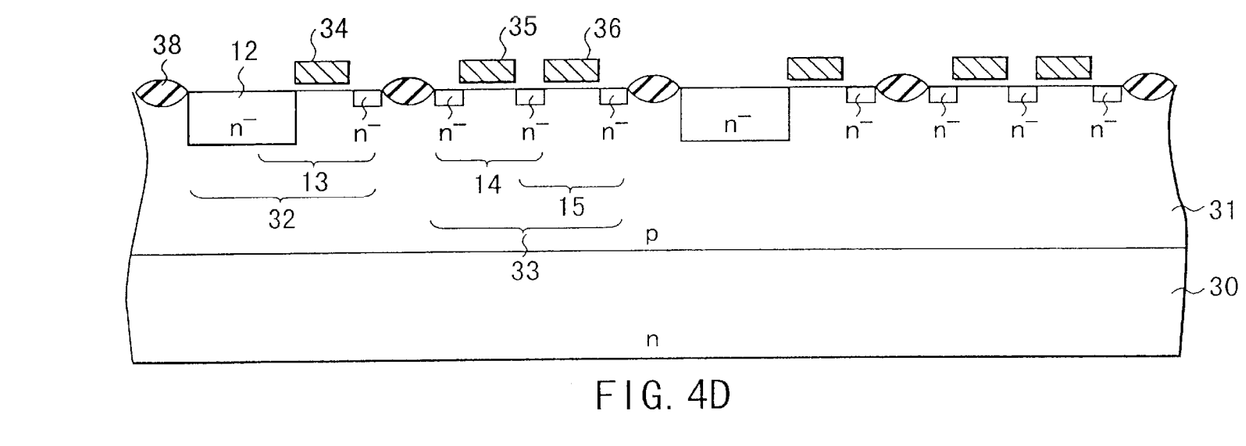

If the pattern 71B is eliminated, a photoelectric conversion section 32 and signal scanning circuit section 33 are formed as shown in FIG. 4D.

The features of the present invention lie in that the p well region 31 is formed in the surface portion of the n type silicon substrate 30 and that the photoelectric conversion section 32 and signal scanning circuit section 33 are formed in the p well area 31. By doing so, those signal charges (electrons) generated at a deeper area of the substrate which have been conventionally caused a problem are discharged toward the n type silicon substrate 30 side and it is possible to reduce those problems called "color mixing" and "blooming" caused by the leakage of electrons from the adjacent pixel.

Figure 5A:
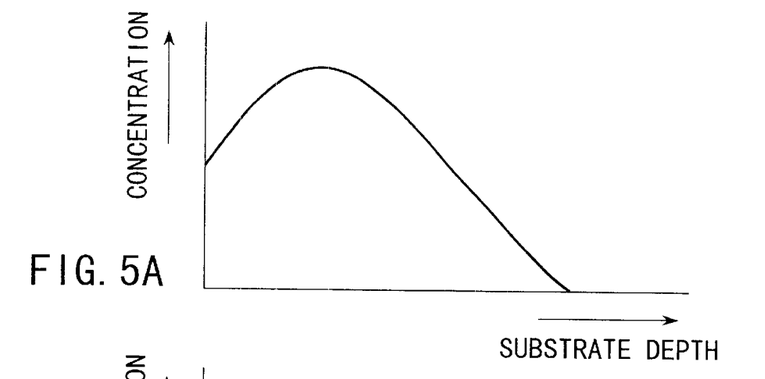
FIGS. 5A and 5B are explanatory views showing concentration profiles of p well areas formed by other manufacturing methods.
Figure 5B:
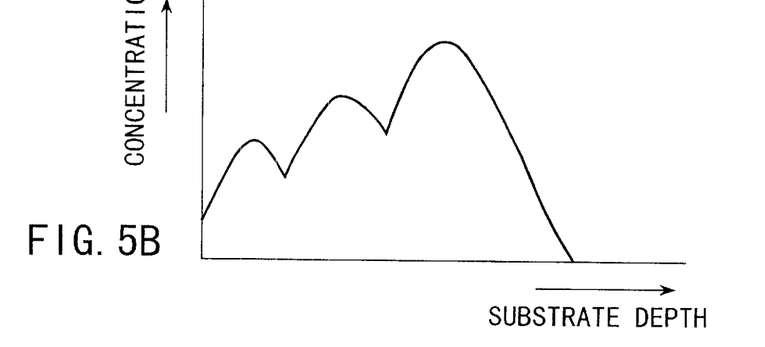

FIGS. 5A and 5B diagrammatically show concentration profiles in the case where the p well area 31 is formed in those methods other than the above-mentioned manufacturing method.

In FIG. 5A, for example, a p type impurity having a concentration of over $1 \times 10^{17}$ cm³ is ion implanted in a range of about 3 to 20 µm from the surface of the n type silicon substrate 30. Thereafter, a p well area 31 is formed, by a heat treatment step, to have a smooth concentration gradient of a p type impurity increasing in concentration from the surface of the substrate 30 to a predetermined depth as the depth is increased.

In FIG. 5B, for example, a plurality of ion implantation steps are done, a plurality of times, with different acceleration voltages. At this time, the p well area 31 is formed to allow a concentration of p type impurity which is ion-implanted to a deepest area from the surface of the n type silicon substrate 30 to be made at over $1 \times 10^{16}$ cm$^3$ and to have a gradient of the p type impurity concentration to be gradually lowered toward the surface of the substrate 30.

In the case where the p well area 31 is so formed as to have such a concentration profile, it is possible to prevent signal charges from being excessively discharged by the n type substrate 30. As a result, it is possible to not only reduce the phenomena "color mixing" and "blooming" but also adequately secure the sensitivity as the MOS type solid-state image sensor.

(Second Embodiment)

Figure 6:
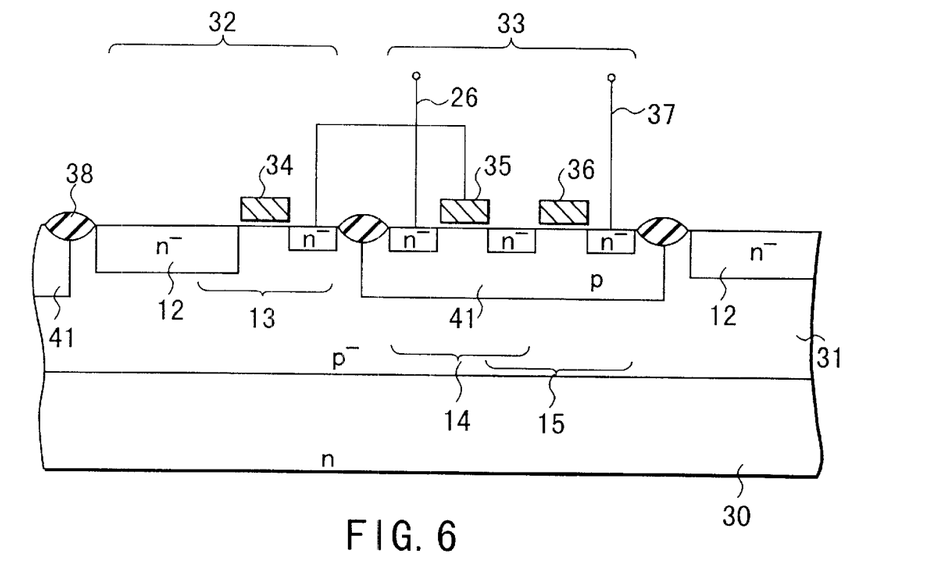
FIG. 6 is a cross-sectional view diagrammatically showing a basic structure of a MOS type solid-state image sensor according to a second embodiment of the present invention.

FIG. 6 is a cross-sectional view schematically showing a basic structure of a MOS type solid-state image sensor according to a second embodiment of the present invention. In FIG. 6, only a major section is shown with the same reference numerals employed to designate parts or elements corresponding to those shown in FIG. 3 and any detailed explanation omitted. Further, the circuit structure is similar to that shown in FIG. 2.

This embodiment is different from the MOS type solid-state image sensor previously explained above in that a second p well area 41 higher in impurity concentration than a p$^-$ well area (first p well area) 31 is formed in a surface portion of the first p$^-$ well area 31 and that a signal scanning circuit section 33 is formed in the second p well region 41. That is, a photoelectric conversion section 32 comprising a photodiode 12 and reading-out transistor 13 is formed in the first p well area 31 and the signal scanning circuit section 33 comprising an amplifying transistor 14, vertical select transistor 15 and reset transistor (not shown) is formed in the second p well area 41.

At this time, the first p well area 31 is formed with a p type impurity concentration of about $1 \times 10^{14}$ cm$^3$ to $1 \times 10^{16}$ cm$^3$ and the second p well are 41 is formed with a p type impurity concentration of about $1 \times 10^{15}$ to $1 \times 10^{17}$ cm$^3$ nearly one order of magnitude greater than the first p well area 31. In the present embodiment, therefore, a photoelectric conversion section 32 is present through the high impurity concentration p well region 41 where the signal scanning circuit section 33 is formed. And it is possible to reduce a signal leakage relative to the photoelectric conversion section 32 and thus reduce the phenomena "color mixing" and "blooming".

Figure 7A:
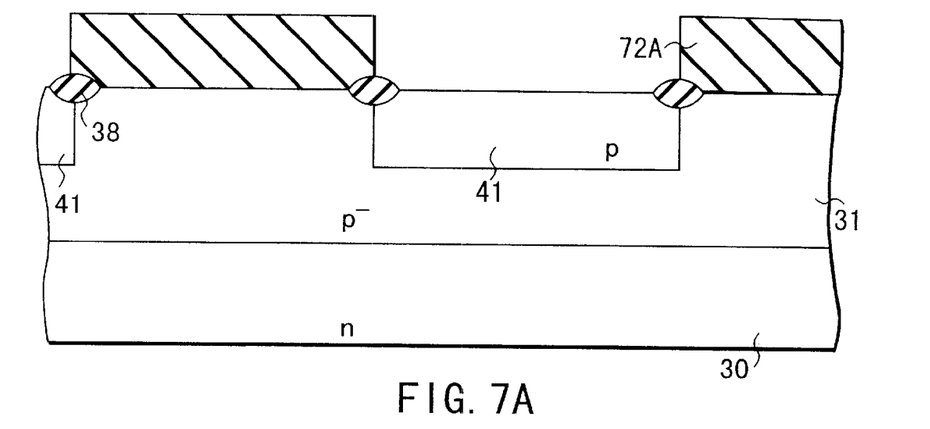
FIGS. 7A to 7C are cross-sectional views for explaining one example of a method for manufacturing a MOS type solid-state image sensor according to the second embodiment of the present invention.
Figure 7B:
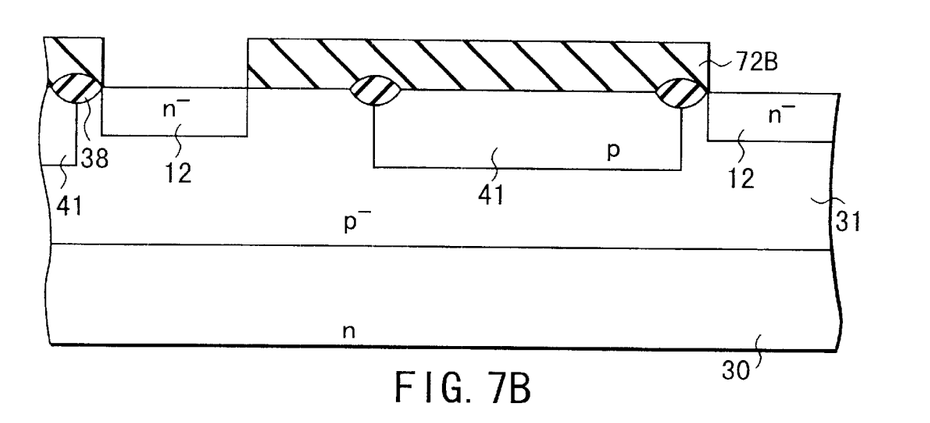
Figure 7C:
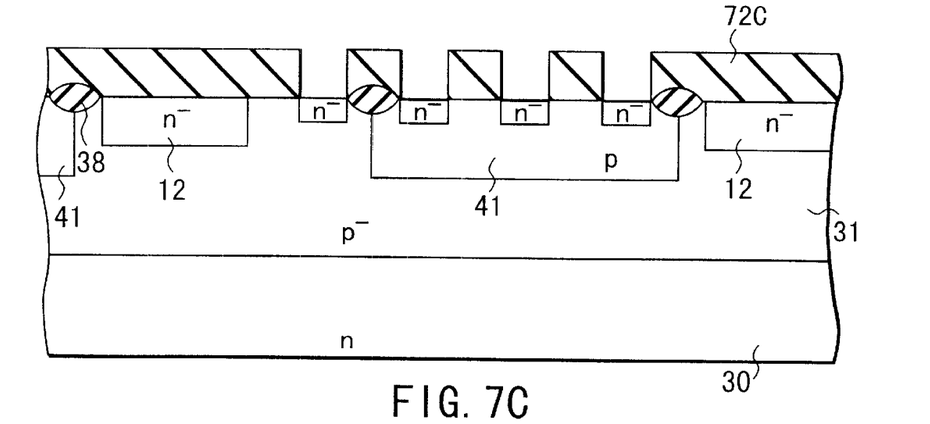

FIGS. 7A to 7C diagrammatically show a method for manufacturing a MOS type solid-state image sensor according to the second embodiment of the present invention.

That is, in a state (See FIG. 4A) in which a first p well area 31 and field oxide film 38 are formed at the surface portion of an n type silicon substrate 30 made at a resistivity of about 10 to 500Ω, as shown in FIG. 7A for example, a desired resist pattern 72A is formed on the surface of the first p well area 31 and, using the pattern 72A as a mask, a second p well area 41 is formed in the surface portion of the first p well area 31.

Then, after the elimination of the pattern 72A, a signal reading-out gate 34,. amplifying gate 35, address gate 36, and the gate of a reset transistor 16 (none of which are shown) are formed and, as shown in FIG. 7B for example, a desired resist pattern 72B is formed on the surface of the first and second p well areas 31 and 41. Using the pattern 72B as a mask (or in selfalignment with the signal reading-out gate 34), photodiodes 12 are formed in the surface portion of the first p well area 31.

Then, after the elimination of the pattern 72B, as shown in FIG. 7C for example, a desired resist pattern 72C is formed on the surface of the first and second well areas 31 and 41 and, using the pattern 72C as a mask (or in self-alignment with the signal reading-out gate 34, amplifying gate 35, address gate 36, and the gate of the reset transistor 16), an n$^-$ diffusion layer serving as the drain of the reading-out transistor 13 is formed in the surface portion of the first p well area 31. At the same time, n$^-$ diffusion layers serving as the sources and drains of an amplifying transistor 14, vertical select transistor 15 and resetting transistor (not shown) are formed in the surface portion of the second p well areas 41.

Thereafter, in the same way as in the first embodiment (See FIG. 4D for example), if the pattern 72C is eliminated, a photoelectric conversion section 32 is formed in the first p well area 31 and a signal scanning section 33 is formed in the second p well area 41.

In the case where the second p well area 41 is formed, a p well area (not shown) with a p type impurity concentration of about $1 \times 10^{15}$ to $1 \times 10^{17}$ cm$^3$ can be simultaneously formed relative to a formation area of a peripheral circuit section 20.

Further, the second p well area 41 can be formed at the same period as that of an ion-implantation step for threshold level control at the signal scanning circuit section 33. Since, in this case, the second p well area 41 can be formed by a minimal heating step, an associated pixel can be minutely formed. And a mask for threshold control can also be used in the formation of the second p well area 41, thus effectively lowering a cost involved.

Further, in the case where, even in the MOS type solid-state image sensor according to the second embodiment, the first p well area 31 is formed with a concentration profile as shown in FIGS. 5A and 5B, it is possible to prevent an excessive discharge of signal charges by the n type silicon substrate 30. As a result, it is possible to not only reduce the phenomena "color mixing" and "blooming" but also secure adequate sensitivity as the MOS type solid-state image sensor.

(Third Embodiment)

Figure 8:
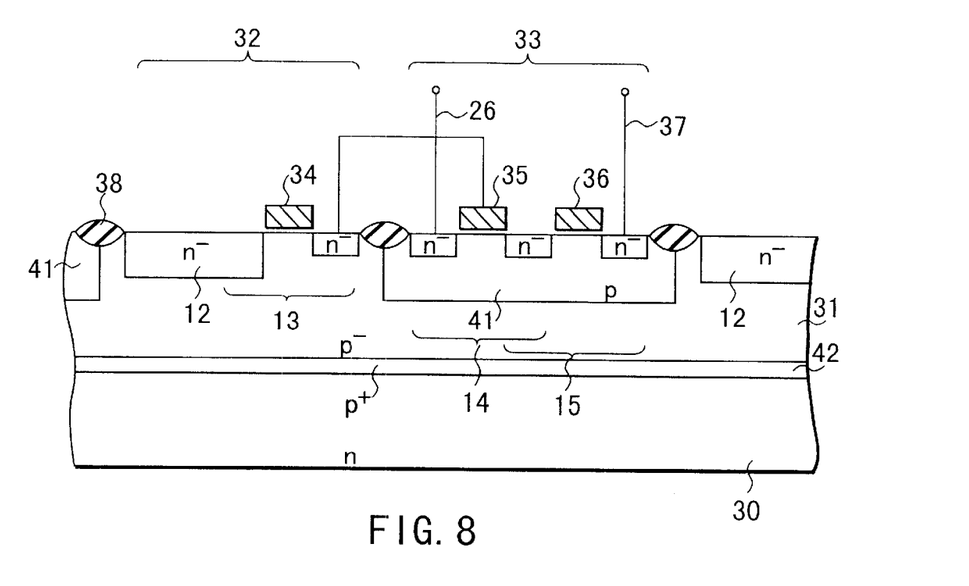
FIG. 8 is a cross-sectional view diagrammatically showing a basic structure of a MOS type solid-state image sensor according to a third embodiment of the present invention.

FIG. 8 is a cross-sectional view diagrammatically showing a basic structure of a MOS type solid-state image sensor according to a third embodiment of the present invention. Here, the same reference numerals are employed to designate parts or elements corresponding to those shown in FIG. 6 and any detailed explanation is therefore omitted. The circuit arrangement is similar to that shown in FIG. 2 above.

The feature of the present embodiment lies in that, in addition to the structure (See FIG. 6) of the MOS type solid-state image sensor according to the second embodiment, a p$^+$ type buried area 42 having a p type impurity concentration of about $1 \times 10^{15}$ to $1 \times 10^{17}$ cm$^3$ higher than that of a first p well area 31 is formed at a base portion of the first p well area 31 (a boundary area between an n type silicon substrate 30 and the first p well area 31).

This p$^+$ type buried area 42 is formed by forming the first p$^-$ well area 31 and p-well area (not shown) of the peripheral circuit section in the surface portion of the n-type silicon substrate 30 whose resistivity is about 10 to 50Ω and then implanting boron ions, etc., at a high acceleration rate (for example, about 800 KeV) into the surface portion of the n type silicon substrate 30.

By doing so, according to the present embodiment, it is possible to obtain the same advantage as that of the second embodiment and also obtain the following advantage. That is, the $p^+$ type buried area 42 is higher in potential than the first p well area 31, thus providing a barrier against electrons entering into the first p well area 31 from the n type silicon substrate 30. Therefore, electrons generated in a deeper area of the n type silicon substrate 30 is less likely to be flowed into a photoelectric conversion section 32, so that a greater advantage is obtained than the first and second embodiments in terms of suppressing the phenomena "color mixing" and "blooming".

Although, in the present embodiment, the MOS type solid-state image sensor according to the second embodiment has been explained as being improved, it may be possible to improve the MOS type solid-state image sensor according to the first embodiment. That is, it may be possible to form a $p^+$ type buried area 42 without forming the second p well area 41 (not shown).

(Fourth Embodiment)

Figure 9:
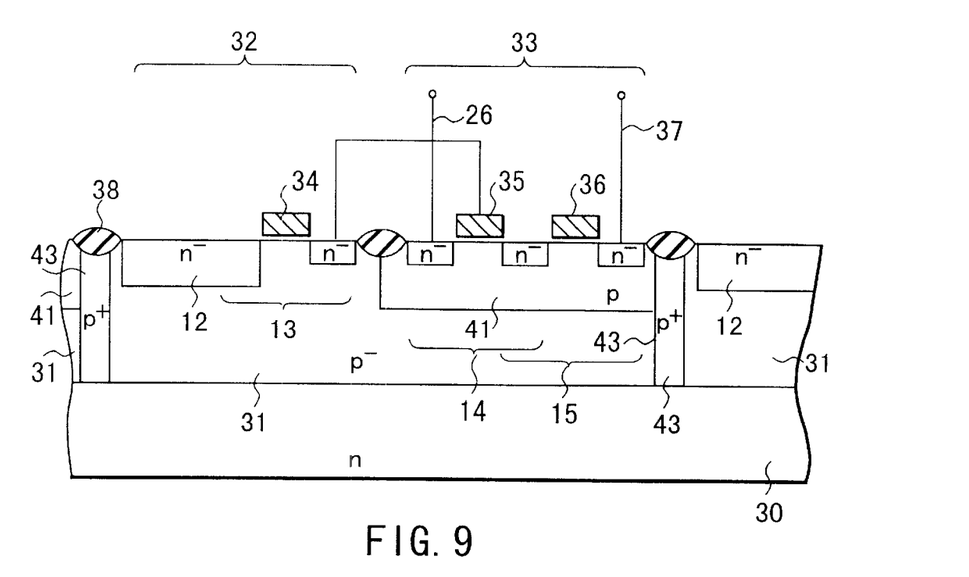
FIG. 9 is a cross-sectional view diagrammatically showing a basic structure of the MOS type solid-state image sensor according to a fourth embodiment of the present invention.

FIG. 9 is a cross-sectional view diagrammatically showing a basic structure of a MOS type solid-state image sensor according to a fourth embodiment of the present invention. Here, the same reference numerals are employed to designate parts or elements corresponding to those shown in FIG. 6 and any detailed explanation is, therefore, omitted. Further, the circuit arrangement is the same as shown in FIG. 2 above.

The feature of the present invention lies in that, in addition to the structure (See FIG. 6) of the MOS type solid-state image sensor according to the second embodiment, a $p^+$ type area 43 for element isolation is formed beneath a field oxide film 38 corresponding to a pixel-to-pixel area. In this case, the $p^+$ type area 43 is so set as to be higher in impurity concentration than a second p well area 41. Further, the $p^+$ type area 43 is formed at least deeper than a second p well area 41, thus further decreasing the leakage of a signal between pixcels. It is, therefore, possible to prevent the generation of the phenomenon "color mixing".

Figure 10A:
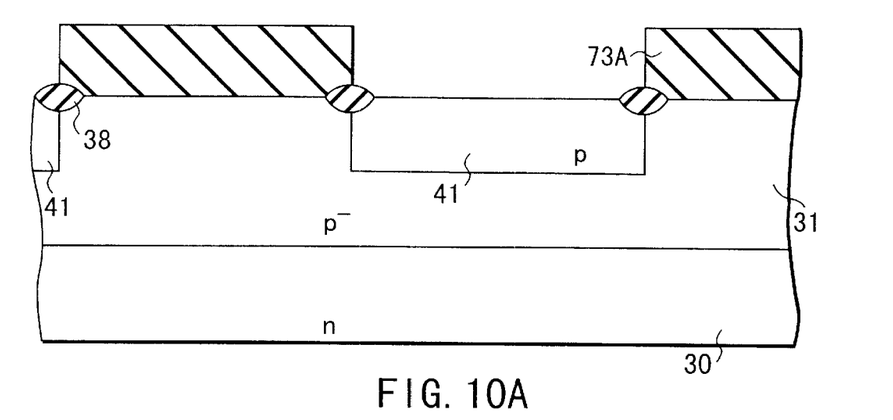
FIGS. 10A to 10C are cross-sectional views for explaining one example of a manufacturing method of a MOS type solid-state image sensor according to a fourth embodiment of the present invention.
Figure 10B:
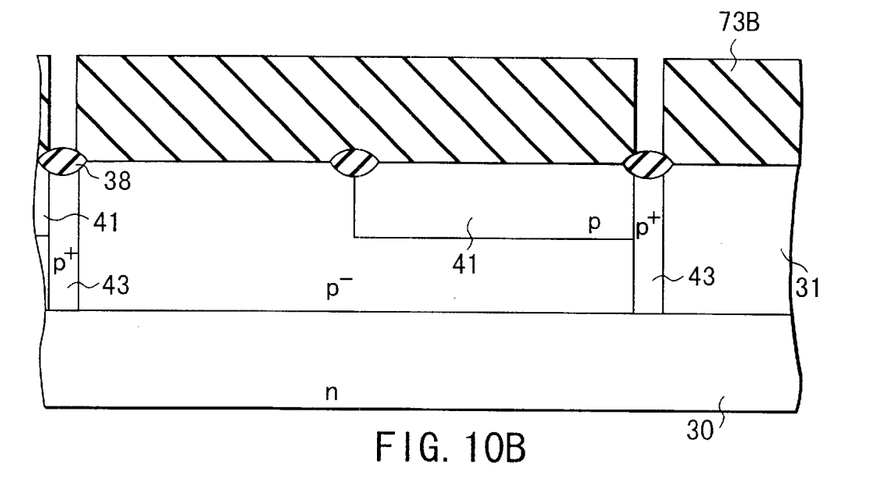
Figure 10C:
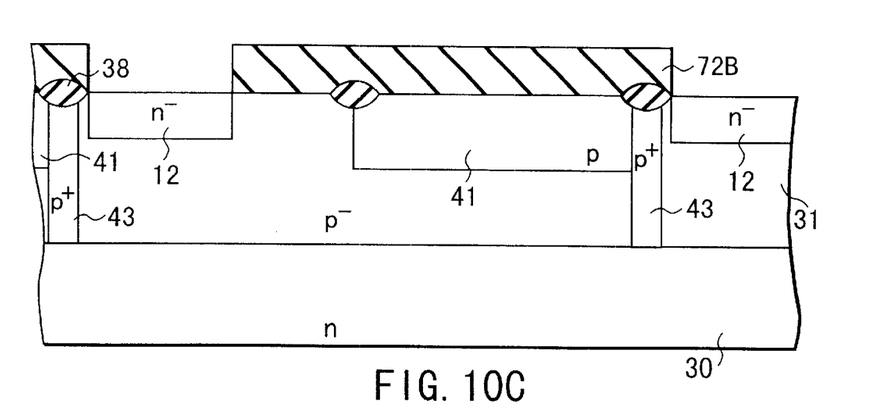

FIGS. 10A to 10C diagrammatically show a manufacturing method of a MOS type solid-state image sensor according to the fourth embodiment above.

That is, in a state (See FIG. 4A) in which a first p well area 31 and field oxide film 38 are formed in a surface portion of an n type silicon substrate 30 whose resistivity is about 10 to 50Ω, as shown in FIG. 10A for example, a desired resist pattern 73A is formed on the surface of the first p well area 31 and, using the pattern 73A as a mask, a second p well area 41 is formed in the surface portion of the first p well area 31.

Then, after the elimination of the above-mentioned pattern 73A, as shown in FIG. 10B for example, a desired resist pattern 73B is formed on the surface of the first and second p well areas 31, 41 and, using the pattern 73B as a mask, ion implantation is carried out a plurality of times at different acceleration voltages to provide an element isolation $p^+$ type area 43 beneath the field oxide film 38.

Thereafter, as in the case of the second embodiment, after the elimination of the pattern 73B, a desired resist pattern 73C is formed on the surface of the first and second p well areas 31 and 41 as shown in FIG. 10C and, using the pattern 73C as a mask, a photodiode 12 is formed in the surface portion of the first p well area 31.

And a photoelectric conversion section 32 is formed in the first p well area 31 and a signal scanning circuit section 33 is formed in the second p well area 41.

Although, in the present embodiment, the MOS type solid-state image sensor according to the present embodiment has been explained as being improved, it may be possible to improve a MOS type solid-state image sensor according to the first embodiment. That is, the $p^+$ type area 43 for element isolation may be formed without forming the second p well area 41.

(Fifth Embodiment)

Figure 11:
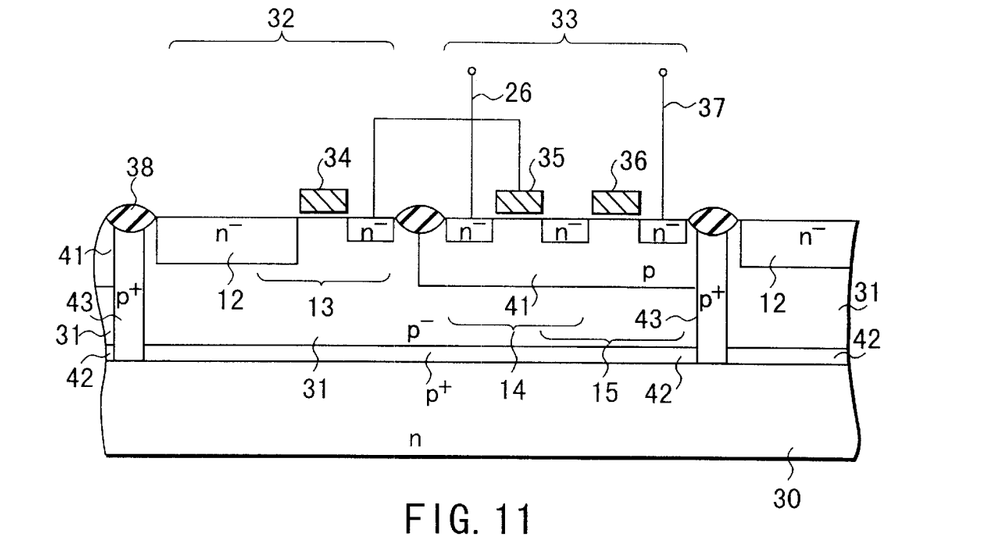
FIG. 11 is a cross-sectional view showing a basic structure of a MOS type solid-state image sensor according to a fifth embodiment of the present embodiment.

FIG. 11 is a cross-sectional view diagrammatically showing a basic structure of a MOS type solid-state image sensor according to a fifth embodiment of the present invention. Here, the same reference numerals are employed to designate parts or elements corresponding to those shown in FIGS. 8 and 9 and any detailed explanation is, therefore, omitted. The circuit arrangement is the same as that shown in FIG. 2.

The present embodiment constitutes a combination of the third and fourth embodiments. That is, the present embodiment is such that, in addition to the structure (See FIG. 6) of the MOS type solid-state image sensor according to the second embodiment having the first p well area 31 and second p well area 41, a $p^+$ type buried area 42 is provided at the base portion (a boundary area between an n type silicon substrate and the first p well area) as in the MOS type solid-state image sensor (See FIG. 8) according to the third embodiment and a $p^+$ type area 43 for element isolation is provided beneath a field oxide film 38 corresponding to a pixel-to-pixel area as in the MOS type solid-state image sensor (See FIG. 9) according to the fourth embodiment. By doing so it is possible to further reduce the leakage of a signal between the pixels and hence to positively prevent the generation of the phenomenon "color mixing".

It is to be noted that, even in the present embodiment, the $p^+$ type buried area 42 and $p^+$ type area 43 may be formed without forming the second p well area 41 (not shown).

(Sixth Embodiment)

Figure 12:
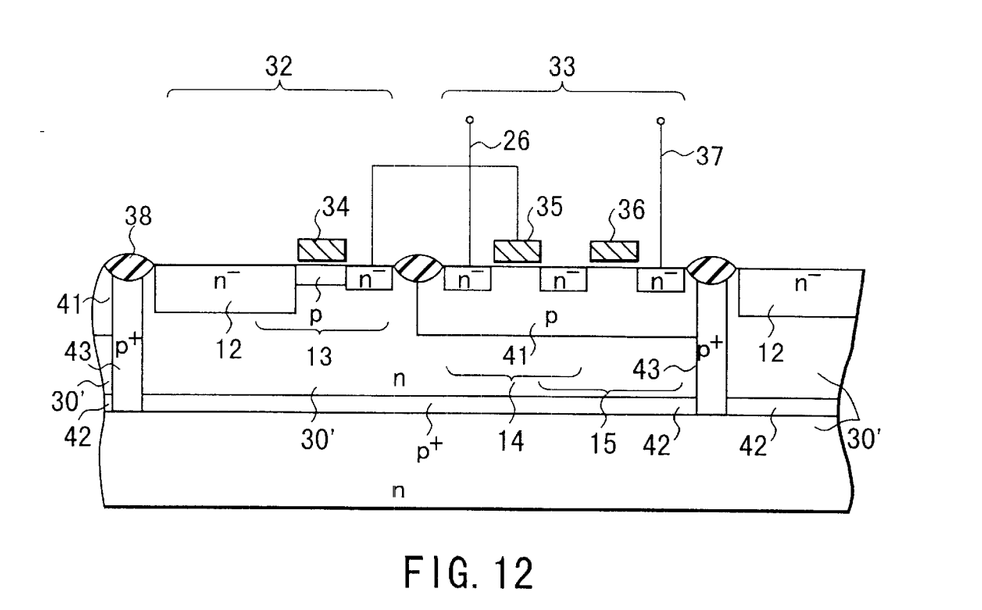
FIG. 12 is a cross-sectional view diagrammatically showing a basic structure of a MOS type solid-state image sensor according to a sixth embodiment of the present invention.

FIG. 12 is a cross-sectional view diagrammatically showing a basic structure of a MOS type solid-state image sensor according to a sixth embodiment of the present invention. Here, the same reference numerals are employed to designate parts or elements corresponding to those shown in FIG. 11 and any detailed explanation is omitted. The circuit arrangement is the same as shown in FIG. 2 above.

In the MOS type solid-state image sensor (See FIG. 11) according to the fifth embodiment, a photoelectric conversion section 32 is formed in the first p well area 31 whereas, in the present embodiment, an n type silicon substrate 30 is directly used without forming a p well area 31. That is, a $p^+$ type buried area 42 is formed by ion implanting a p type impurity to a depth of, for example, 5 μm from the surface of the n type silicon substrate 30' and a p well 41 is formed in the surface portion of the substrate 30'. And a signal scanning circuit section 33 is formed at the p well area 41 and a photoelectric conversion section 32 is formed at the surface portion of the substrate 30. And a $p^+$ type area 43 for element isolation is formed beneath a field oxide film 38 corresponding to the pixel-to-pixel area.

In such a structure, it is needless to say that the same advantage as in the above-mentioned fifth embodiment is obtained. And the capacity of the photodiode 12 is substantially increased and it is advantageous to minutely form pixels involved.

In the case where, in the present embodiment, an upper side of the $p^+$ type buried area 42 in the substrate 30' for example is formed as being an n well area (n type semiconductor substrate), a p type silicon can be used as the substrate 30' at the lower side of the $p^+$ type buried area 42 (not shown).

(Seventh Embodiment)

Figure 13A:
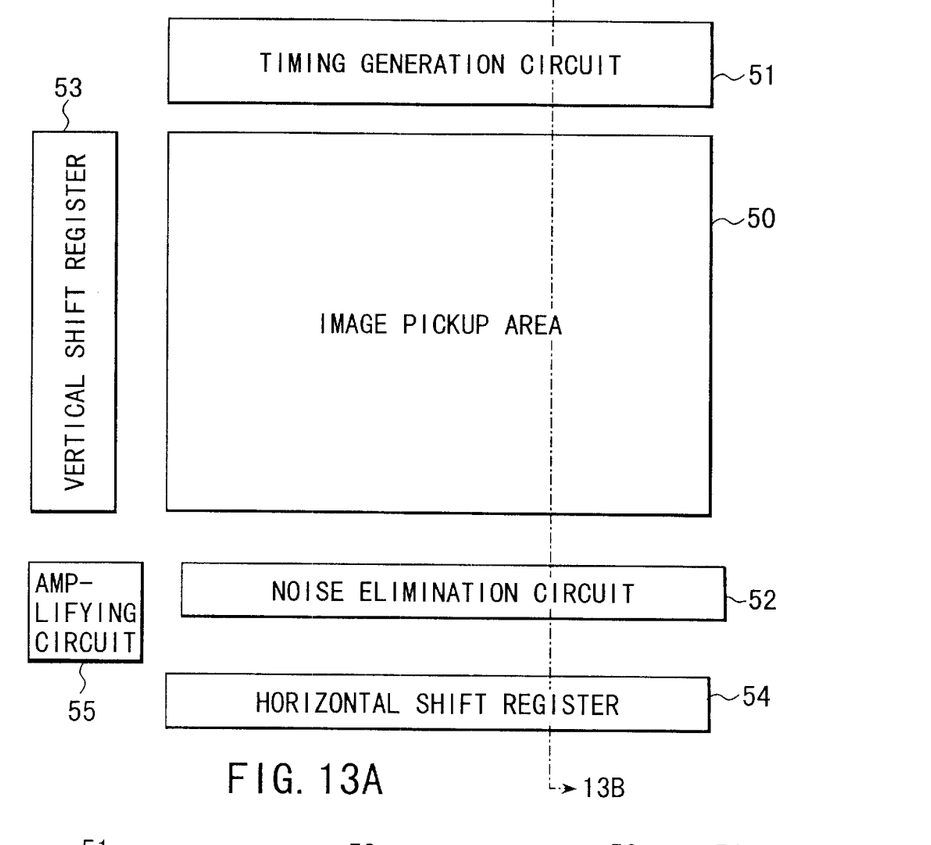
FIG. 13A is a plan view diagrammatically showing a basic structure of a MOS type solid-state image sensor according to a seventh embodiment of the present invention.
Figure 13B:
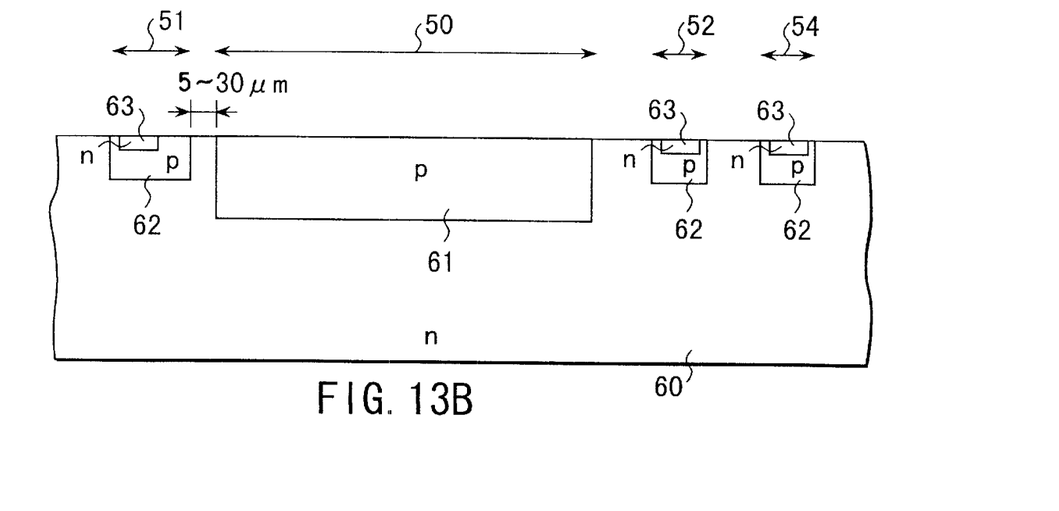
FIG. 13B is a cross-sectional view showing the basic structure of the MOS type solid-state image sensor as taken along line 13B-13B in FIG. 13A.

FIG. 13A is a plan view diagrammatically showing a basic structure of a MOS type solid-state image sensor according to a seventh embodiment of the present invention and FIG. 13B is a cross-sectional view as taken along line 13B—13B in FIG. 13A.

In FIGS. 13A and 13B, reference numeral 50 shows an image pickup area comprising a photoelectric conversion section and signal scanning circuit section and 51, 52, 53, 54 and 55 constitute peripheral circuit sections, that is, a timing generation circuit, noise elimination circuit, vertical shift register, horizontal shift register and amplifying circuit. Further, 60 shows an n type silicon substrate and 61 a first p well area formed in the image pickup area 50. 62 shows third p well areas where the above-mentioned timing generation circuit 51, horizontal shift register 54 and amplifying circuit 55 are respectively formed. In the case where a CMOS circuit is included in the third p well area 62, an n well area 63 is formed in the p well area 62.

The feature of the present embodiment lies in that the respective circuits 51, . . . , 55, including the image pickup area 50, are. formed in independent p well areas 61, 62. For example, the p well area 61 and p well area 62 is separated by a width of about 5 to 30 μm in a substrate surface direction in an n type silicon substrate 60. For this reason, an analog circuit is less affected by noise generated from a digital circuit. That is, since the image pickup area 50, noise elimination circuit 52 and amplifying circuit 55 constitute analog circuits, these are liable to be affected by noise generated from the digital circuits such as the timing generation circuit 51, vertical shift register 53, horizontal shift register 54, etc. However, by separating the p well areas 61 and 62 it is possible to prevent any adverse effect on the analog circuit which is generated from the digital circuit. As evident from the above, the present embodiment is particularly effective to the case where analog and digital circuits are mounted in a mixed way.

(Eighth Embodiment)

Figure 14:
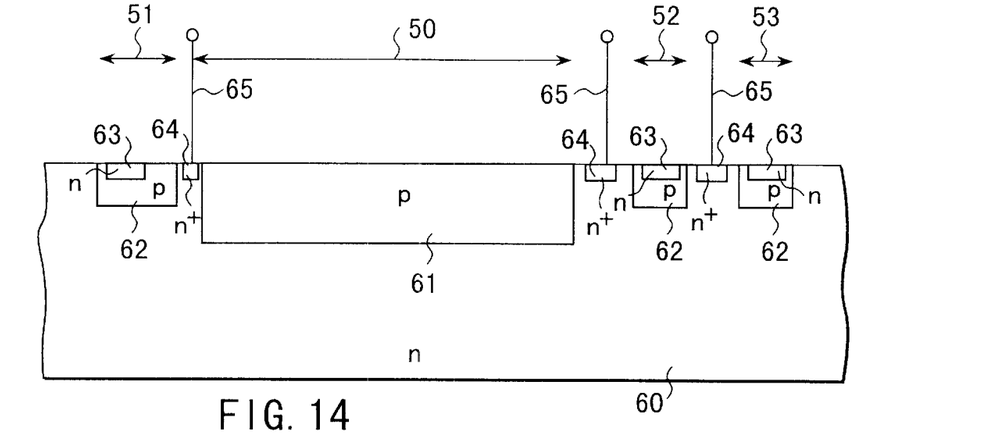
FIG. 14 is a cross-sectional view diagrammatically showing a basic structure of a MOS type solid-state image sensor according to an eighth embodiment of the present invention.

FIG. 14 is a cross-sectional view diagrammatically showing a basic structure of a MOS type solid-state image sensor according to an eighth embodiment of the present invention. Here, the same reference numerals are employed to designate parts or elements corresponding to those shown in FIG. 13B and any detailed explanation is, therefore, omitted.

The present embodiment is different from the above-mentioned seventh embodiment in that $n^+$ well areas 64 for forming a CMOS circuit are formed in the surface portions of an n type silicon substrate 60 in which p well areas 62 are separated from a p well area 61 and that lead wires 65 are connected to the $n^+$ well areas 64 to achieve grounding. By doing so, the $n^+$ well area 64 provides a guard ring by which it is possible to prevent an oscillation of the n type silicon substrate 60 among the respective circuits 51 to 55. Therefore, the present embodiment enhances an effect in comparison with the seventh embodiment.

(Ninth Embodiment)

Figure 15:
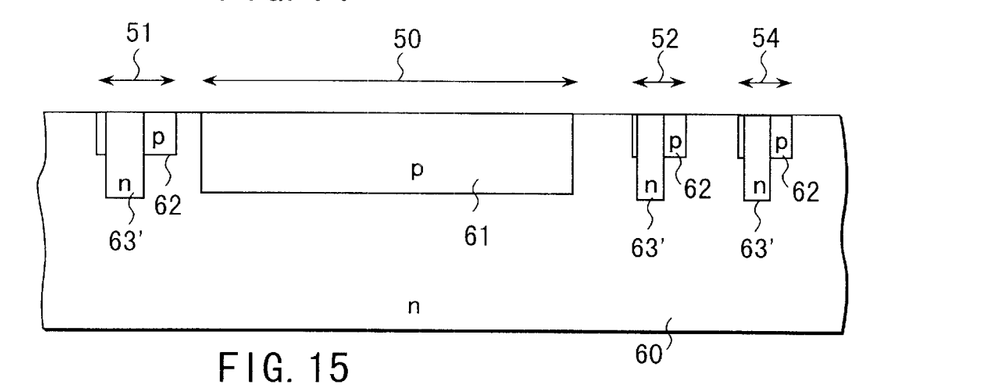
FIG. 15 is a cross-sectional view diagrammatically showing a basic structure of a MOS type solid-state image sensor according to a ninth embodiment of the present embodiment.

FIG. 15 is a cross-sectional view diagrammatically showing a basic structure of a MOS type solid-state image sensor according to a ninth embodiment of the present invention. Here, the same reference numerals are employed to designate parts or elements corresponding to those shown in FIG. 13B and any detailed explanation is omitted.

The present embodiment is different from the above-mentioned embodiment in that an n well area 63' formed in a p well area 62 is formed to a depth position equal to (or greater than) the p well area 61 and reaches an n type silicon substrate 60. In this case, the n type well area 63' is the same potential as that of the substrate 60 and it is possible to provide a stable circuit. Further, depending upon the position of the n type well area 63' it is possible to reduce "jumping" noise from respective circuits 51 to 55 of the peripheral circuit section into an image pickup area 50.

Here, the n well area 63' is formed by, for example, forming a p well are 61 and, thereafter, implanting n type impurity ions to a depth position equal in depth to, and greater in depth than, the p well area 61 to allow them to be diffused there. Or the n well area 63' may be formed earlier than the p well area 61 and also can be formed by implanting an ion species, such as phosphorus, a plurality of divided times at different acceleration voltages.

(Tenth Embodiment)

Figure 16:
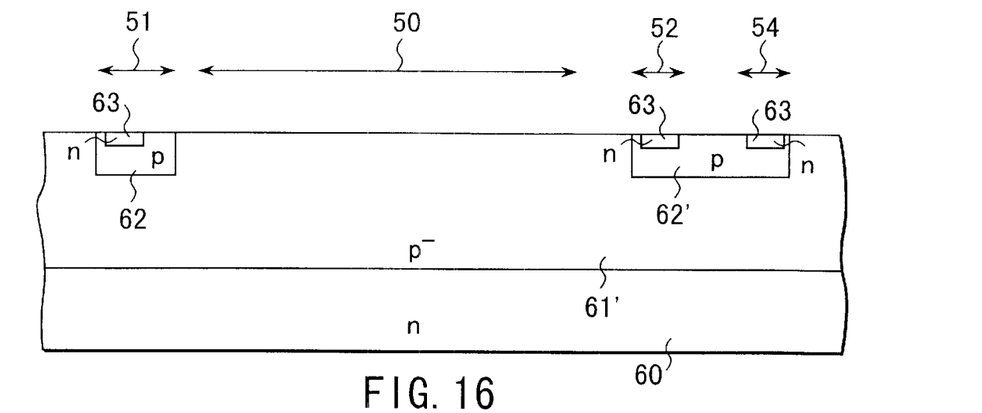
FIG. 16 is a cross-sectional view showing a basic structure of a MOS type solid-state image sensor according to a tenth embodiment of the present embodiment.

FIG. 16 is a cross-sectional view diagrammatically showing a basic structure of a MOS type solid-state image sensor according to a tenth embodiment of the present invention. Here, the same reference numerals are employed to designate parts or elements corresponding to those shown in FIG. 13B and any detailed explanation is, therefore, omitted.

The present embodiment is different from the above-mentioned seventh embodiment in that a $p^-$ well area (first p well area) 61' is formed in a surface portion of an n type silicon substrate 60 and an image pickup area 50 is formed at the surface of the first p well area 61' and that, among respective circuits 51 to 54 in a peripheral circuit section, a digital circuit is formed in a common p well area 62'. In this case, it can be manufactured by the above-mentioned first and second embodiments and, since the first p well are 61' is so formed, it is possible to obtain the same advantage as in the above-mentioned first and second embodiments and the present embodiment is also less likely to be affected from noise originating from the digital circuit.

If, even in the tenth embodiment, an n well area 63 is so provided as to reach an n type silicon substrate 60, it is possible to expect more enhanced effect.

The present embodiment is not restricted to the above-mentioned embodiments. The basic structure of the unit cell constituting one pixel is not restricted to the arrangement shown in FIG. 2 and any structure may be used if it can amplify signal charges obtained at the photoelectric conversion section and take out it.

The depth and impurity concentration of the respective well area are not particularly restricted but it is generally preferable to have the following ranges. For example, the depths of the first p well areas 31, 61 may have a range of 3 to 20 μm from the surface of the n type silicon substrates 30, 60. The impurity concentrations of the first p well areas 31, 61 may have a range of $1 \times 10^{14}$ cm$^3$ to $1 \times 10^{16}$ cm$^3$. The impurity concentration of the second p well area 41 is preferably one or more orders of magnitude higher than that of the first p well area 31. The impurity concentration of the $p^+$ type area 43 for element isolation is preferably one or more orders of magnitude higher than that of the second p well area 31. The impurity concentration of the $p^+$ type buried area 42 is preferably one or more orders of magnitude higher than that of the first p well area 31.

Although, in the seventh and eighth embodiment, explanation will be made about several kinds of circuits 51 to 55, the kinds of circuits are not restricted thereto. Depending upon the object of the system, there is sometimes a case where a signal processing circuit, image compression circuit, memory, etc., are mounted on a common substrate. Even in this case, such an embodiment is effective. Although the circuits 51 to 55 other than the image pickup area 50 are formed at the wells of the same concentration, this is not restricted thereto though being dependent upon the specification of associated circuits. Further, although the p well area 62 is all separated in the n type silicon substrate 60 or n well area 64, this is not restricted thereto though being dependent upon the specification of the system. For example, it may be possible that only the p well area of the analog circuit is separated in the n type silicon substrate or n well area and that the digital circuit is formed in a common p well area.

Various changes or modifications of the present invention can be made without departing from the spirit and scope of the present invention.

According to the present invention, as set out above, the n type substrate is used as a semiconductor substrate and a plurality of p well areas are provided in the substrate surface portion and the photoelectric conversion section and signal scanning circuit section are formed in different p well area. By doing so, it is possible to positively prevent those signal charges which are generated at a deeper area of the substrate from leaking into an adjacent pixel. As a result, it is possible to suppress the phenomena "blooming" and "color mixing".

Further, as the semiconductor substrate use is made of an n type substrate and a plurality of p well areas are formed in the surface portion of the substrate and the image pickup area and various kinds of peripheral circuits are formed in different p well areas. By doing so it is possible to separate respective circuits, in particular, separate the image pickup area of the analog circuit from the digital circuit of the peripheral circuits. As a result, it is possible to prevent the noise of the digital circuit and oscillation of the substrate from exerting any adverse effect on an analog waveform involved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A metal oxide semiconductor (MOS) type solid-state image sensor comprising:

an n type semiconductor substrate;

at least one first p well area provided in a surface portion of the n type semiconductor substrate;

a plurality of second p well areas selectively provided at a surface portion of the first p well area and higher in p type impurity concentration than the first p well area;

an image pickup area comprising a two-dimensional array of row and column unit cells having a photoelectric conversion section provided in the first p well area and a signal scanning circuit section in the second p well area; and a plurality of signal lines respectively reading out signal charges from the unit cells in the image pickup area.

2. A MOS type solid-state image sensor according to claim 1, further comprising an element isolation area provided at a surface of the first p well corresponding to a boundary area of the unit cell-to-unit cell area and a p type area for element isolation which is formed along the element isolation area and is higher in p type impurity concentration than the second p well area.

3. A MOS type solid-state image sensor according to claim 2, wherein the p type area for element isolation is formed at least from the surface of the first p well area to a depth deeper than that of the photoelectric conversion section.

4. A MOS type solid-state image sensor according to claim 1, further comprising a p type buried area formed at a boundary area between the first p well area and the n type semiconductor substrate and higher in p type impurity concentration than the first p well area.

5. A MOS type solid-state image sensor according to claim 1, further comprising a p type buried area provided at a boundary area between the first p well area and the n type semiconductor substrate and higher in p type impurity concentration than the first p well area and an element isolation p type area provided at the surface of the first p well area at least corresponding to a boundary area of the unit cell-to-unit cell area and a p type area for element isolation formed from the surface of the first p well area along the element isolation area to a depth area deeper than the depth of the photoelectric conversion section and higher in p type impurity concentration than the second p well area.

6. A MOS type solid-state image sensor according to claim 1, the first p well area has a gradient of a concentration gradually increasing from a surface portion of the n type semiconductor substrate to a predetermined depth as its depth is increased.

\* \* \* \* \*